(12) United States Patent
Patapoutian et al.

(10) Patent No.: US 8,627,175 B2
(45) Date of Patent: Jan. 7, 2014

(54) OPPORTUNISTIC DECODING IN MEMORY SYSTEMS

(75) Inventors: Ara Patapoutian, Hopkinton, MA (US); Bernardo Rub, Sudbury, MA (US); Bruce D. Buch, Westborough, MA (US)

(73) Assignee: Seagate Technology LLC, Cupertino, CA (US)

( * ) Notice: Subject to any disclaimer, the term of this patent is extended or adjusted under 35 U.S.C. 154(b) by 416 days.

(21) Appl. No.: 12/891,490

(22) Filed: Sep. 27, 2010

(65) Prior Publication Data

US 2012/0079355 A1     Mar. 29, 2012

(51) Int. Cl.
*G11C 29/00*     (2006.01)

(52) U.S. Cl.
USPC .......................................... 714/763; 714/773

(58) Field of Classification Search
USPC .................................. 714/763, 773
See application file for complete search history.

(56) References Cited

U.S. PATENT DOCUMENTS

| 7,023,735 | B2 | 4/2006 | Ban et al. |
| 7,518,913 | B2 | 4/2009 | Wang et al. |
| 7,558,109 | B2 | 7/2009 | Brandman et al. |
| 7,751,237 | B2 | 7/2010 | Alrod et al. |
| 7,757,153 | B2 | 7/2010 | Hwang et al. |
| 7,843,736 | B2 | 11/2010 | Kang et al. |
| 2005/0013165 | A1 | 1/2005 | Ban |
| 2006/0028875 | A1 | 2/2006 | Avraham et al. |
| 2007/0086239 | A1 | 4/2007 | Litsyn et al. |
| 2007/0283227 | A1 | 12/2007 | Sharon et al. |
| 2008/0270730 | A1 | 10/2008 | Lasser et al. |
| 2009/0282319 | A1 | 11/2009 | No et al. |
| 2009/0319868 | A1 | 12/2009 | Sharon et al. |
| 2010/0020604 | A1 | 1/2010 | Cornwell et al. |
| 2010/0088575 | A1 | 4/2010 | Sharon et al. |
| 2010/0091535 | A1 | 4/2010 | Sommer et al. |
| 2010/0118608 | A1 | 5/2010 | Song et al. |
| 2010/0131697 | A1 | 5/2010 | Alrod et al. |
| 2010/0199149 | A1* | 8/2010 | Weingarten et al. ........... 714/773 |
| 2010/0223538 | A1* | 9/2010 | Sakurada ...................... 714/801 |
| 2011/0231738 | A1* | 9/2011 | Horisaki ....................... 714/773 |
| 2011/0280084 | A1* | 11/2011 | Radke et al. .............. 365/185.21 |
| 2012/0079355 | A1 | 3/2012 | Patapoutian et al. |

FOREIGN PATENT DOCUMENTS

| WO | WO2007132453 | 11/2007 |
| WO | WO2007132457 | 11/2007 |
| WO | WO2008026203 | 3/2008 |
| WO | WO2008053472 | 5/2008 |

OTHER PUBLICATIONS

File history for U.S. Appl. No. 12/891,475.
U.S. Appl. No. 12/891,475, filed Sep. 27, 2010, Patapoutian et al.
Lee et al., "Drain Read Disturb Assessment of NOR Flash Memory", IEEE, 2008, 2 pages.

* cited by examiner

*Primary Examiner* — M. Mujtaba K Chaudry
(74) *Attorney, Agent, or Firm* — Hollingsworth Davis, LLC

(57) ABSTRACT

Approaches for decoding data read from memory cells of a nonvolatile, solid state memory involve attempting to decode hard data using a hard decoding process prior to a time that soft data is available to the decoder. The hard data includes information about the digital symbols stored in the memory cells without data confidence information. The soft data includes information about the digital symbols stored in the memory cells and data confidence information. In response to the hard decoding process failing to achieve convergence, after the soft data becomes available to the decoder, the soft data is decoded using a soft decoding process. The decoder generates an output of the decoded data after the hard decoding process or the soft decoding process achieves convergence.

18 Claims, 10 Drawing Sheets

OPPORTUNISTIC DECODING IN MEMORY SYSTEMS

SUMMARY

Various embodiments described in this disclosure are generally directed to methods, devices, and systems that use opportunistic decoding to decode data stored in non-volatile solid state memory cells.

Methods of decoding data read from memory cells of a nonvolatile, solid state memory may involve attempting to decode hard data using a hard decoding process prior to a time that soft data is available to the decoder. In response to the hard decoding process failing to achieve convergence, after the soft data becomes available to the decoder, the soft data is decoded using a soft decoding process. The hard data includes information about the digital symbols stored in the memory cells without data confidence information. The soft data includes information about the digital symbols stored in the memory cells and data confidence information. In some cases, one or both of the hard decoding process and the soft decoding process may be low density parity check (LDPC) decoding processes. The decoder generates an output of the decoded data after the hard decoding process or the soft decoding process achieves convergence.

The hard data can be acquired from an initial read operation of the memory cells that uses an initial reference voltage. The soft data may be determined using information obtained from an additional read of the memory cells that uses an additional reference voltage.

In some cases, a request to acquire information used to determine the soft data and/or a request to determine the soft data is made only if the hard decoding process fails to achieve convergence. In some cases, a request for information used to determine the soft data and/or a request to determine the soft data and/or initiation of the soft decoding process occurs independently of the success or failure of the hard decoding process to achieve convergence. If the soft decoding process fails to achieve convergence, an additional soft decoding process operating on additional soft data may be implemented, for example.

In some scenarios, a request to acquire information used to determine the soft data made before the hard decoding process has successfully or unsuccessfully concluded. The acquisition of the information using to determine the soft data is terminated in response to the hard decoding process achieving convergence. Similarly, a request to determine the soft data and/or the soft decoding process itself may be initiated before the hard decoding process has successfully or unsuccessfully concluded. The soft data determination process and/or the soft decoding process are terminated if those processes have begun and the hard decoding process achieves convergence.

One or both of the hard decoding process and the soft decoding process may include a plurality of decoding subprocesses, each of the decoding subprocesses capable of independently achieving convergence. Each of the decoding subprocess may test a different decoding hypothesis and/or implement a different decoding algorithm. All of the decoding subprocesses may operate concurrently, all of the decoding subprocesses may operate sequentially, or some may operate concurrently and some sequentially.

In some cases, all of the subprocesses operate on the same input data, and, in other cases, the decoding subprocesses operate on different input data. For example, one of the decoding subprocesses may operate on hard data and another of the decoding subprocesses may operate on soft data. For example, one of the decoding subprocesses may operate on soft data determined from a first source of information and another of the decoding subprocesses may operate on second soft data determined from a second source of information.

A solid state memory device may include a decoder having input circuitry configured to receive hard data and soft data. The decoder circuitry opportunistically attempts to decode the data using a hard decoding process operating on the hard data during a time that the soft data is not yet available to the decoder circuitry. In response a failure of the hard decoding process to achieve convergence, the decoder circuitry implements a soft decoding process operating on the soft data after the soft data becomes available to the decoder. Output circuitry is configured to output the decoded data obtained from the hard decoding process or the soft decoding process.

In various scenarios, the control circuitry may generate a request for information used to determine the soft data in response to the hard decoding process failing to achieve convergence or may generate a request for information used to determine the soft data independently of whether or not the hard decision decoding process fails to achieve convergence. The control circuitry may generate a request for information used to determine the soft data before the hard decoding process achieves convergence and may cancel the request for the information in response to the hard decoding process achieving convergence.

A solid state memory device may include solid state memory cells and a detector configured to perform read operations to read data stored in the memory cells. The detector may output hard data including information about the data read from the memory cells without confidence information. Soft information circuitry is configured to generate soft data that includes information about the data read from the memory cells and confidence information The soft information circuitry may be configured to determine the soft data using one or more of the following sources of information: noise statistics of the memory cell, information acquired during additional read operations, the bit error rate, the significance of the bit being read, e.g. whether the bit is a most significant bit (MSB) or a least significant bit (LSB), characterization of the threshold voltage distribution of the memory cells from measurements of memory cell threshold voltages, estimation of the threshold voltage distribution based on operational history of the memory cells, which includes, for example, write operation parameters, retention time, number of erase/write cycles, number of cold write cycles, the operating temperature of the device and/or other factors.

Methods of decoding data read from memory cells of a solid state memory device, may involve implementing multiple decoding processes that operate concurrently to decode data read from the memory cells. Each of the multiple decoding processes is capable of independently decoding the data to convergence. Each of the multiple decoding processes may implement a different algorithm to decode the data and/or each of the multiple decoding processes may test a different decoding hypothesis. An output of the decoded data can be generated from the result of the decoding processes that is first-in-time to achieve convergence. After the first-in-time decoding process achieves convergence, a signal is generated to stop decoding processes that have not yet achieved convergence.

In some cases the decoding processes may operate on the same input data. In some cases, each of the decoding processes may operate on different input data. For example, one of the decoding processes may operate on hard data and another of the decoding processes may operate on soft data.

As another example, one of the decoding processes may operate on soft data determined from a first source of information and another of the decoding processes may operate on soft data determined from a second source of information.

These and other features can be understood in view of the following detailed discussion and the accompanying drawings.

DETAILED DESCRIPTION

Figure 1:
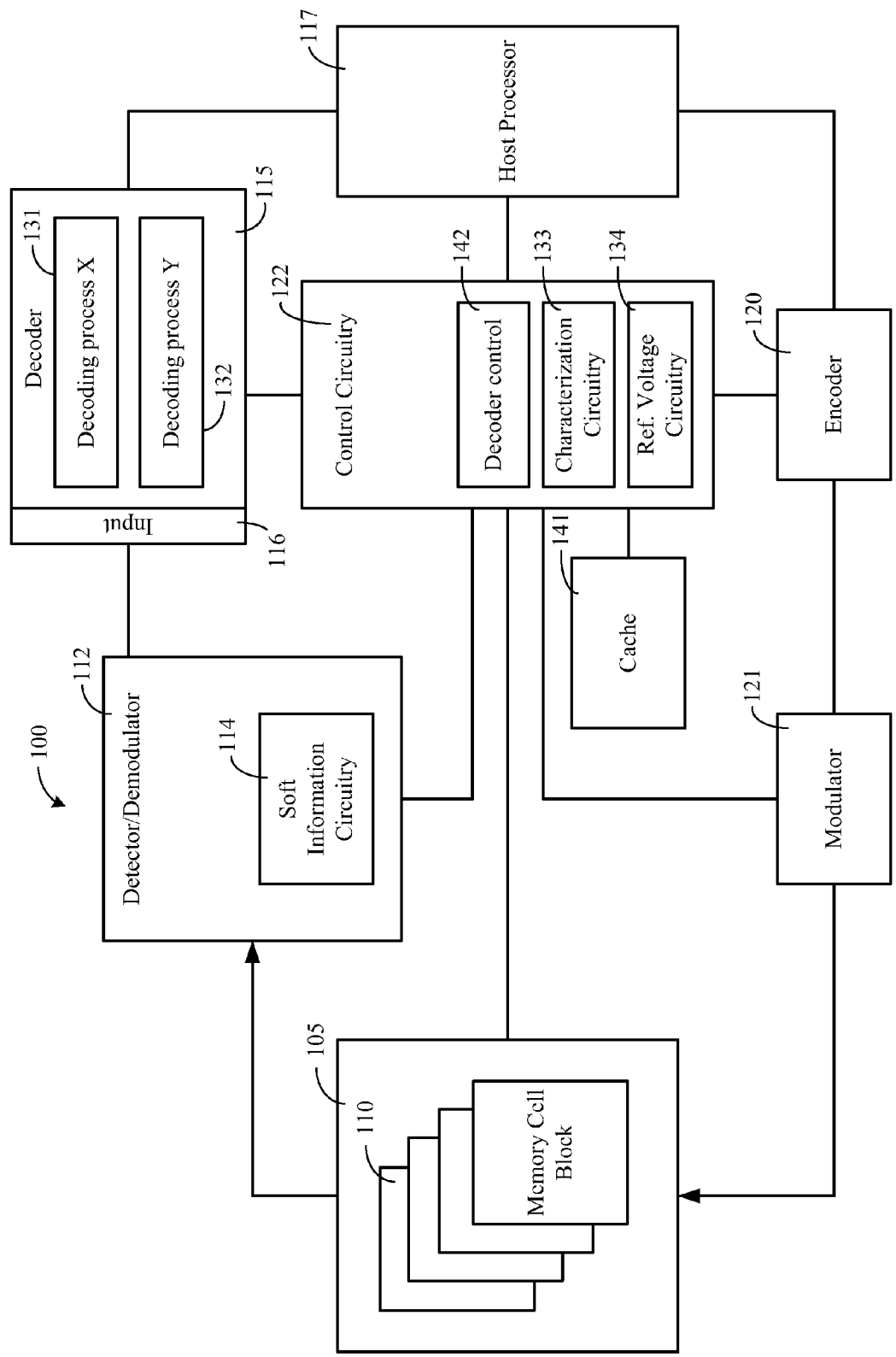
FIG. 1 is a block diagram of a memory system.

Solid state, non-volatile memory cells are capable of storing data in the form of stored charge retained in transistor memory cells. Data stored in the memory cells can be read by sensing the analog threshold voltage of the transistor which corresponds to the amount of stored charge. In some cases, the memory cells may include a floating gate that is surrounded by dielectric which allows the charge to be stored and retained on the floating gate. Other mechanisms for storing charge in non-volatile memory cells are known, such as storage in traps within the nitride layer of silicon oxide nitride oxide (SONOS) transistors, for example. Errors in the data read from non-volatile memory cells may arise from various sources, including noise during the read and/or write operations of the memory cells, charge leakage from the memory cells, and/or other disturbances that result in charge loss or charge gain.

Errors present in data read from memory cells can often be identified and/or corrected in decoder circuitry using an error correcting code (ECC). Some decoders implement hard decoding processes that only take into account hard data, i.e., the digital symbols identified by performing a read operation of the memory cells without using confidence information that estimates the reliability of the data read from the memory cells.

Soft data includes information about the digital symbols read from the memory cells and also includes data confidence information. The data confidence information provides a reliability estimate that the digital symbols read from the memory cells correspond to the data that was encoded for storage in the memory cells. Confidence information may be determined from a variety of sources that yield additional information about the data read from the memory cell as discussed in more detail below. For example, the data confidence information may be determined from an additional read operation of the memory cells that uses a reference voltage that is shifted from the reference voltage used in the initial read operation. As another example, the data confidence information may be determined from error probabilities based on channel noise characteristics.

In some implementations, the soft data is expressed as the log likelihood ratio (LLR). For each data bit, $b_i$, the LLR can be defined based on the probability ratio $p(b_i=0|y)/p(b_i=1|y)$ where $p(b_i=0|y)$ is the probability that bit $b_i$ is a 0 and $p(b_i=1|y)$ is the probability that bit $b_i$ is a 1. The LLR for each bit may be expressed in terms of a signed number. For example, the signed numbers can range from +10 to −10. The sign of the number represents the likely state of the bit, with a positive sign representing the logic state 0 and a negative sign representing the logic state 1. The magnitude of the number represents the degree of confidence in the estimated logic state. For example, a +1 output from the decoder can indicate that the bit is estimated to be a logic zero, but confidence is low. A +5 can indicate that the bit is estimated to be a logic zero and a +10 can represent that the bit is estimated to be logic zero with high confidence. A −4 indicates that the bit is probably a logic one.

Some decoders, such as Low Density Parity Check (LDPC) decoders, are capable of implementing soft decoding processes that operate on soft data. LDPC decoders are also capable of implementing hard decoding processes that operate on hard data. For example, LDPC decoders, which are usually designed to handle soft data, can also handle hard data using a lookup table that converts the soft data to the high confidence values. Using these high confidence values, the LDPC decoding process for hard decoding can be identical to the LDPC soft decoding process.

Examples described in this disclosure involve opportunistically attempting to decode the data read from the memory cells using hard data before soft data is available to be decoded. For example, memory controller circuitry may request both hard data and soft data before starting the decoding, but, because the soft data takes longer to obtain than the hard data, there is period of time that can be used opportunistically to attempt to decode the data read from the memory cells using the hard data. If the hard decoding process fails to achieve convergence, after the soft data becomes available, a soft decoding process operating on the soft data is implemented.

FIG. 1 is a block diagram of a memory system 100 including a solid state memory 105 comprising a number of memory cells 110 that can be arranged in data units such as blocks and/or pages. A host processor 117 may be coupled to the memory 105 so that data transferred from the host processor 117 can be stored in the memory 105 and data read from the memory 105 can be transferred to the host processor 117. Before the data is stored in the memory, the data is typically encoded using an ECC by encoder 120. A modulator 121 generates the electrical signals required to cause the encoded data to be stored in the memory cells 110 of the memory 105.

A detector/demodulator 112 includes circuitry to perform read operations of the memory cells 110. A read operation of a memory cell involves determining the analog threshold voltage of each memory cell, which is related to the amount of charge stored by the memory cell, and converting the analog threshold voltage into a digital symbol. The solid state memory 105 may comprise single level cells (SLC) or multilevel cells (MLC). A SLC memory is capable of storing one bit per memory cell, whereas an MLC memory is capable of storing digital symbols of two, three, or more bits per memory cell.

The detector 112 is capable of reading the data stored in the memory cells 110 and providing a hard data output representing the data. The hard data output includes digital symbols read from the memory cells without confidence information. Soft information circuitry 114 may be provided in the detector 112 or elsewhere. The soft information circuitry 114 is capable of providing a soft data output that includes information about the digital symbols read from the memory cells and also includes data confidence information. The soft data output can be provided in the form of an LLR as discussed above. A number of sources can provide the detector with the additional information used to derive the confidence information as described in more detail below.

The decoder 115 is capable of implementing a number of decoding processes, represented in FIG. 1 as decoding process X 131 and decoding process Y 132. Although only two decoding processes 131, 132 are shown in FIG. 1, any number of decoding processes can be implemented. Each of the decoding processes 131, 132 is capable of independently decoding data and achieving convergence of the data if the errors in the data are not prohibitive. Each of the decoding processes 131, 132 may operate on different input data. In some cases, one of the decoding processes 131, 132 is a hard decoding process that operates on hard data and another one of the decoding processes 132, 131 is a soft decoding process that operates on soft data. In some cases, both of the decoding processes 131, 132 are soft decoding processes that operate on soft data derived from different sources. In some cases, each of decoding processes 131, 132 implements a different decoding algorithm and/or tests a different hypothesis for the decoding. The decoding processes 131, 132 may implement different decoding algorithms and/or use different hypotheses while operating on the same input data, or each decoding process 131, 132 may operate on different input data.

The decoder 115 receives the hard and/or soft data via the decoder input circuitry 116 which may include a data buffer, for example. In a first example, the decoder 115 may opportunistically attempt to decode the hard data before the soft data is available to the decoder 115. In a second example, the decoder 115 may opportunistically attempt to decode a first type of soft data determined from a first source before a second type of soft data determined from a second source is available to the decoder 115. If the opportunistic attempt to decode the hard data is unsuccessful, when the soft data (in the first example above) or the second type of soft data (in the second example above) becomes available, the decoder decodes the soft data. In some cases, the decoder may wait to determine if the attempt to opportunistically decode the data is successful.

Decoder control circuitry 142 may generate signals that request acquisition of information used to determine the soft data, may generate signals that request determination of the soft data and/or may generate signals that initiate the hard or soft decoding processes. In some cases, request signals for acquisition of information used to determine the soft data, request signals for determination of the soft data and/or request signals for initiation of the soft decoding process may be generated by the controller circuitry 122 only if the hard decoding process (or another soft decoding process) fails to achieve convergence. In some cases, request signals for acquisition of information used to determine the soft data, request signals for determination of the soft data and/or request signals for initiation of the soft decoding process may be generated by the controller circuitry 122 regardless of whether or not the hard decoding process fails to achieve convergence. For example, the request for acquisition of information used to determine the soft data, the request for determination of the soft data and/or the request for initiation of the soft decoding process may be generated by the controller circuitry 122 before the successful or unsuccessful conclusion of the hard decoding process. If the request signals are generated before the conclusion of the hard decoding process and the hard decoding process eventually achieves convergence, the controller circuitry 122 may terminate acquisition of information used to determine the soft data, terminate determination of the soft data and/or terminate the soft decoding process The above example may be extended the scenario wherein the decoder 115 opportunistically attempts to decode using first soft data before second soft data is available. When any of the decoding processes achieves convergence, the control circuitry 122 may initiate a control signal to terminate other concurrently operating processes. The control circuitry 122 may generate appropriate signals to control some functions of the read and/or write operations of the memory, such as requests for one or more read operations of the memory cells that include information about the reference voltage to be used for the read operation, for example.

The block diagram of FIG. 1 and other systems, modules, devices, or processes described herein may illustrate or discuss components in functional groups. It will be appreciated by those skilled in the art that there exist many possible configurations in which the functionality of the systems, modules, devices, and/or processes can be arranged and/or implemented. For example, in some cases, the detector, the demodulator and/or the modulator may be implemented as components of the memory. In some cases, the decoder, encoder, control circuitry, and/or cache may be implemented as components of a memory controller that is separate from the memory. In some cases, the memory may be flash memory and the decoder, encoder, and control circuitry may be part of a flash memory controller The examples depicted herein provide some functional arrangements, while many other functional arrangements are possible. The various approaches described herein may be implemented using hardware, software, or a combination of hardware and software, for example.

Figure 2:
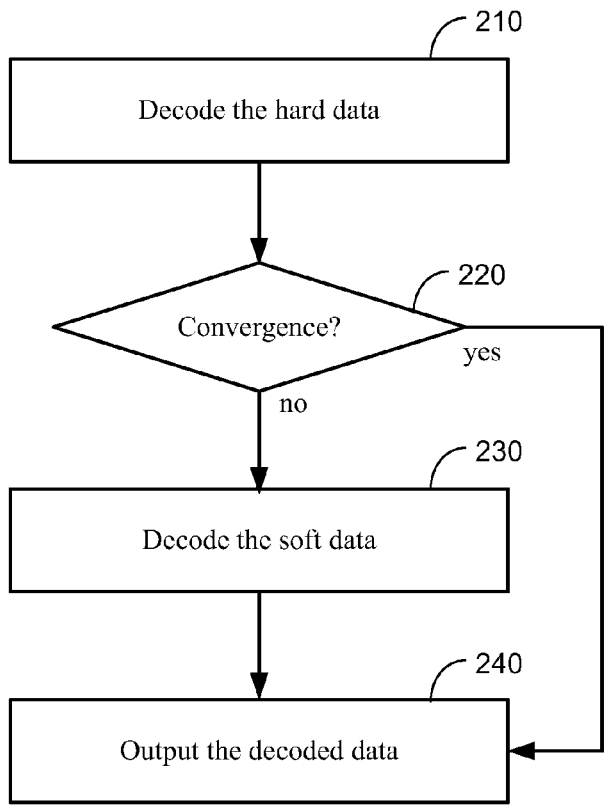
FIG. 2 is a flow diagram illustrating a process of decoding data read from memory cells.

FIG. 2 is a flow diagram illustrating a process of decoding data read from memory cells. An initial read of the memory cells provides hard data comprising the digital symbols without confidence information. In some cases, the controller may request soft data from the detector substantially concurrently with a request for hard data. The soft data includes information about the digital symbols stored in the memory cells along with confidence information. Typically, the soft data takes longer to acquire than the hard data because the additional information must be acquired and processed. Before soft data is available to the decoder, the decoder opportunistically attempts to decode 210 the hard data using a hard decoding process. If the opportunistic attempt to decode the hard data is successful 220, i.e., the decoder achieves convergence using the hard data, the decoder outputs 240 a signal representing the decoded data which can be sent to the host processor, for example. If the decoder is unsuccessful in its opportunistic attempt to achieve convergence 220 using the hard data, the decoder uses a soft decoding process to decode 230 the soft data and outputs 240 the decoded data.

The data confidence may be derived from one or more sources that provide information about whether the digital symbols read from the memory cells correspond to the digital symbols that were intended to be written to the memory cell. Data confidence is inversely related to noise. The noise may be instantaneous noise that can change the data as the data is being written to the memory cells or as the data is being read from the memory cells. Noise can also encompass charge leakage and/or disturb effects that occur during the time that the data is retained in the memory cells, i.e., after the data has been stored but before the data is read. The variance (spread) of the threshold voltage distribution of the memory cells reflects the amount of noise associated with data read from the memory cells.

Sources that provide information about the reliability of the data may include, but are not limited to, the noise statistics of the read and/or write channel of the memory, the bit error rate (BER) associated with the memory cells being read, the significance of the bits being read, e.g., whether the bits are most significant bits (MSBs) or least significant bits (LSBs), the parameters of the write operation used to write the data to the memory cells, e.g., the variance of the threshold voltage distribution after a write operation, a measured characterization of the threshold voltage distribution, the length of time that data has been stored in the memory cells, the potential for disturb effects during the period of time that the data has been stored and/or the operational history of the memory cells including the number of erase/write cycles, the number of write cycles at cold temperatures, etc.

The "write channel" of solid state non-volatile memory may be thought of as including circuitry from the output of the encoder to the memory cell. The "read channel" of a solid state non-volatile memory may be thought of as including circuitry from the memory cell to the input of the decoder. Errors in the data may occur within the read and/or write channels, for example, due to bitline-to-bitline capacitive coupling, random noise, 1/f noise, electromagnetic interference (EMI) and/or other noise sources. In some cases, the noise probability function (which may be estimated as additive Gaussian, or other probability functions, for example) is used to determine the soft data.

The past performance of the memory cells may predict their future performance. For example, the bit error rate (BER) determined for previous read operations of a memory cell page or block can be used to generate soft data for a current read operation.

As previously described, some digital symbols can be more susceptible to errors than others, particularly for certain types of charge loss/gain effects. Additionally the significance of the bit of the digital symbols can be a factor. For example, pages of most significant bits may be more susceptible to charge leakage effects than pages of least significant bits. Therefore, the significance of the bits being read may be taken into account when the soft data is determined.

Memory cell write operation can involve cycles of applying the programming voltages to the memory cells and then verifying the data written in the cells. The variance of the threshold voltage distribution of the memory cells being programmed decreases as the number of program and verify cycles increases. Threshold voltage distributions with lower variance can be achieved with a large number of programming cycles. However, a large number of programming cycles adds to the program latency of the device and/or may be more destructive to the gate oxide, and thus may be undesirable. Knowledge of the parameters of the write operation, e.g., the variance of the threshold voltage achieved by the write operation and/or how many programming cycles were used to program the memory cells may be a factor in the derivation of soft data.

Characterization of the threshold voltage distribution may involve measurement of the threshold voltage of the cells or a sample of cells which can occur before the memory is used, e.g., factory characterization, or characterization during the use of the memory. The controller circuitry may include a module to initiate and/or characterization of the memory cells (see, 133, FIG. 1). In some cases, characterization of the memory cells may occur during use of the memory cells at a convenient time, such as during garbage collection operations.

An estimated threshold voltage distribution may be determined based on the memory cell configuration and/or the operational history of the memory cells. The memory cell configuration factors may include the physical and material configuration of the memory cell, e.g., dimensions, thickness, and doping, etc. The operational history of the memory cell may include the history of program/erase cycles experienced by the memory cell, the history of read, write, and erase operations performed on other memory cells that can potentially affect the charge stored on the memory cell, the retention time, i.e., length of time that the charge has been stored on the memory cell, the temperature of the memory cell at the time of the write operation, the operating temperature of the memory, and/or other factors. The characterization data and/or the operational history of the memory cell and/or other information may be stored in a cache (see 141, FIG. 1) and accessed at a later time for use in determining the soft data.

Figure 3A:
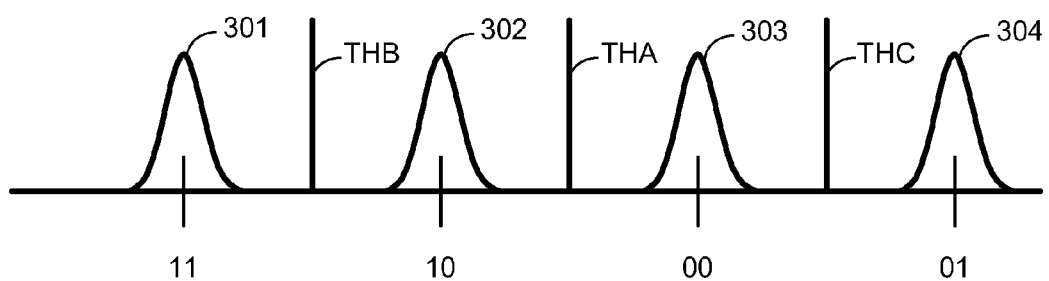
FIG. 3A depicts idealized threshold voltage distributions for a multi level cell memory capable of storing two bits per memory cell.

Idealized threshold voltage distributions for an MLC memory capable of storing two bits per memory cell are illustrated in FIG. 3A. In this example, the digital symbol 11 requires the lowest voltage and may represent the erased state. Voltage distribution 301 is associated with the digital symbol 11, voltage distribution 302 is associated with digital symbol 10, voltage distribution 303 is associated with the digital symbol 00, and voltage distribution 304 is associated with the digital symbol 01. For each digital symbol, the digit on the left is the most significant bit (MSB) and the digit on the right is the least significant bit (LSB).

The number of reference voltages required to read a memory cell is equal to s−1, where s is the number of digital symbols that can be stored in the memory cell. For example, a one bit memory cell is capable of storing one of two one-bit digital symbols, a 0 or a 1. One nominal reference voltage is needed to discriminate between the threshold voltages representing these two symbols. As another example, a two bit memory cell is capable of storing one of four two-bit symbols, 00, 01, 10, 11. Three reference voltages are needed to discriminate between these four digital symbols. Reading the digital state of a memory cell may be accomplished by comparing the sensed threshold voltage levels of the MLC memory cells to one or more reference voltages, represented as THA, THB, THC in FIG. 3A. Comparison to a first reference voltage, THA, discriminates the MSB bit of the digital state stored in the memory cell. If the sensed voltage is lower than THA, then the state of the MSB is 1 and if the sensed voltage is greater than THA, then the state of the MSB is 0.

Reading the LSB requires comparison to an additional reference voltage. If the sensed voltage is less than THA, then comparison to reference THB discriminates between an LSB of 1 and an LSB of 0. If the sensed voltage is less than THB, then the LSB stored in the memory cell is 1. If the sensed voltage is greater than THB, then the LSB stored in the memory cell is 0. If the sensed voltage is greater than THA, then comparison to reference voltage THC discriminates between an LSB of 1 and an LSB of 0. If the sensed voltage is greater than THC, then the LSB is 1. If the sensed voltage is less than THC, then the LSB is 0.

The distances between the edges of the distributions 301, 302, 303, 304 and the location of the reference voltages THA, THB, THC affect the error rate of the memory cells. If any of the voltage distributions overlap the reference voltages THA, THB, THC, data errors are likely to occur. Thus, it is desirable to maintain acceptable distribution margins between the edges of the distributions and the reference voltages THA, THB, THC.

Figure 3B:
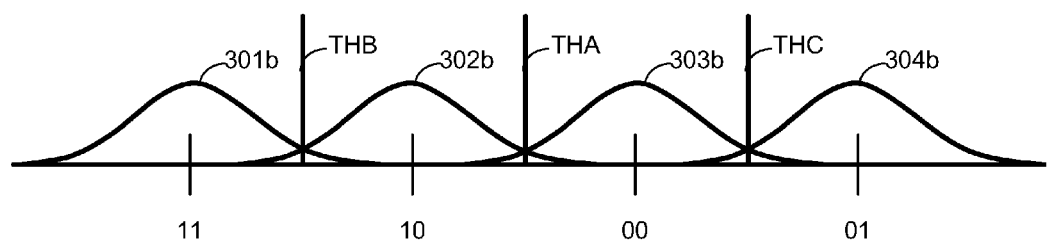
FIG. 3B depicts noisy threshold voltage distributions that overlap each other.

Various factors can change the analog threshold voltage stored in memory cells, causing the voltage distributions of a memory device (or a data unit of a memory device, such as a data page) to change and to overlap each other or overlap the reference voltages. The susceptibility to change and/or the amount of voltage shift experienced by any particular memory cell may vary from one memory device to another, may vary from one memory cell page to another, may vary from memory cell to memory cell within a memory page, and/or may vary depending on the history of the memory cell. Noise from any source causes the variance of the threshold voltage distributions to increase, as illustrated by the voltage distributions 301b, 302b, 303b, 304b in FIG. 3B. The digital symbols read from the memory cells having threshold voltage distribution distributions 301b, 302b, 303b, 304b would have a relatively lower confidence than digital symbols read from memory cells having threshold voltage distributions 301, 302, 303, 304 in FIG. 3A.

Charge leakage is one mechanism that causes changes in the threshold voltage of memory cells and can cause errors in the stored data. For example, for some flash memory, a charge loss on the order of 10,000 electrons from the floating gate can alter the threshold voltage of the memory cell. Charge leakage occurs over time as charge is lost from the floating gate due to a number of factors.

Other mechanisms that can increase or decrease the amount of stored charge include soft-write and disturb effects. These effects occur when the threshold voltage of a memory cell is unintentionally altered by local electrical signals during operation of the memory. For example, soft writing can occur when the threshold voltage of a memory cell is increased as the memory cell is being read. Repetitive reading of the memory cell can cause the cell to become slowly programmed over time.

Memory cells can be subject to disturb effects caused by voltages applied to read, write or erase other cells in the memory. Disturb effects can be classified as read disturb, write (or program) disturb, and erase disturb. These effects typically arise in memory cells that share the same wordline or bitline and can result in charge loss or charge gain. For example, non-selected cells may be subject to write disturb when another cell on the same wordline is being programmed. During the write operation of a selected memory cell, a non-selected erased cell may accumulate additional charge so that the non-selected cell becomes a programmed cell (or differently programmed cell). If the non-selected cell was already a programmed cell, the non-selected cell may lose charge during the write operation of the selected cell to the point that the non-selected cell becomes an erased cell.

Floating gates of flash memory are surrounded by thin oxides. Exposure of thin oxides to high field stress and/or high levels of charge injection may cause the oxides to conduct via stress induced leakage current (SILC) even at relatively low fields. For example, memory cells can gain charge under relatively low gate stress present during a read operation of a neighboring cell and can become programmed. Each stress cycle damages the thin oxide causing the cell to become more vulnerable to read disturb (and/or other disturb effects) due to SILC.

Charge loss and/or disturb effects generally increase as the oxide layer that insulates the floating gate degrades. Oxide degradation can increase with each erase/write cycle experienced by the memory cell. Write operations that occur at lower temperatures, e.g., below about 10 degrees C., are more destructive to the gate oxide of a memory cell than write operations at higher temperatures. The operating temperature of the memory cell (at times other than write operations) can also influence memory cell degradation and affect charge leakage and/or other effects. As the memory cells are erased, written, and read, each memory cell can acquire a unique operational history which affects its susceptibility to errors. The various operational histories of the memory cells of a data unit, such as a page, for example, cause the threshold voltage distributions for that page to shift over time.

Confidence information may be based on an additional measurement of the threshold voltage of a memory cell. In some cases, a first read operation of a memory cell data unit, e.g., a page, is used to determine hard data for the page. At least one additional read operation of the page can used to determine the soft data. For example, the first read operation of the page may be performed using a nominal reference voltage. The additional read operation of the page may be performed using a reference voltage that is shifted from the nominal voltage. The additional read operation provides more precision in the reading of the threshold voltages of the memory cells of the page. This higher precision information may be translated into a measure of data confidence. It will be understood that the additional reference voltage referred to above may be an additional set of reference voltages if the memory cells are multilevel memory cells.

Figure 4:
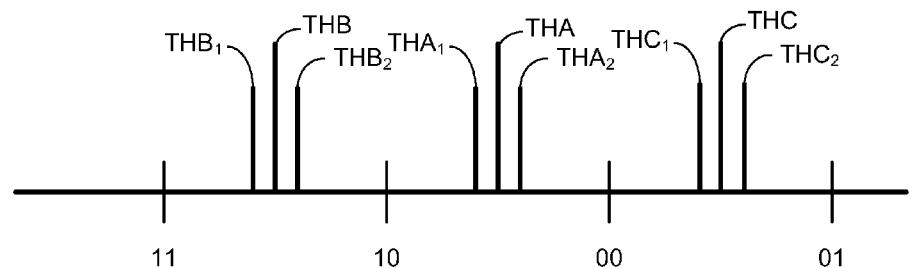
FIG. 4 illustrates reference voltages that are shifted from nominal reference voltages by a set amount.

In some implementations, the reference voltage that is shifted from the nominal reference voltage may be shifted by a set, incremental amount. FIG. 4 illustrates shifted reference voltages $THB_1$, $THB_2$, $THA_1$, $THA_2$, $THC_1$, $THC_2$, which are shifted from the nominal reference voltages, THB, THA, THC by a set amount. For example, the detector performs a first read operation using the set of nominal reference voltages THB, THA, THC, then performs a second read operation using the first set of shifted reference voltages, $THB_1$, $THA_1$, $THC_1$, and may perform a third read operation using the second set of shifted reference voltages, $THB_2$, $THA_2$, $THC_2$. The first read operation performed using the set of nominal reference voltages THB, THA, THC provides the hard data.

Additional read operations using shifted reference voltages can provide information about data reliability. For example, if the first read operation using a first reference voltage indicates that the threshold voltage is less than THC and the second read operation using a second reference voltage indicates that the threshold voltage is even less than $THC_1$, then that information may be interpreted to provide a higher confidence in the data than if the second read operation indicates that the threshold voltages is less than THC but greater than $THC_1$.

Figure 5:
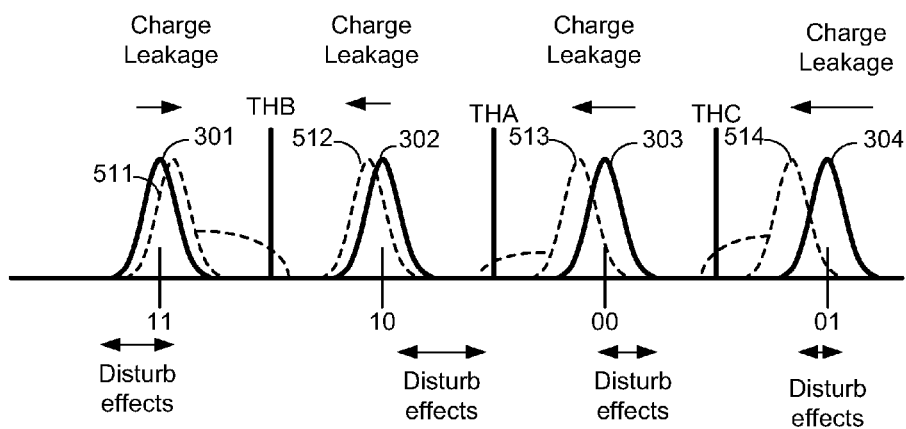
FIG. 5 illustrates voltage distributions that have been shifted and/or distorted due to charge leakage, soft write, and/or disturb effects.

In some situations, the initial and/or shifted reference voltages may be shifted by an amount that compensates for an expected charge loss or charge gain from the memory cells. FIG. 5 illustrates voltage distributions 511, 512, 513, 514 after the initial voltage distributions 301, 302, 303, 304, also illustrated in FIG. 3, are shifted and/or distorted due to charge leakage, soft write and/or disturb effects. Charge leakage over time typically causes the voltage distributions 302, 303, 304 to shift from a higher voltage to a lower voltage as charge leaks from the memory cells. Memory cells storing symbols represented by higher voltages, e.g., symbols 00 and 01 in FIG. 5, may experience a larger charge leakage shift than symbols represented by lower voltages, e.g., symbols 10 in FIG. 5. In FIGS. 3-5, digital symbol 11 is represented by a negative voltage and symbols 10, 00, and 01 are represented by positive voltages. Note that the negative voltage distribution 301 representing the digital symbol 11 exhibits a shift which is opposite in direction to the shifts of the positive distributions 302, 303, 304 due to the opposite polarity of the threshold voltages.

FIG. 5 also depicts that disturb effects can operate to shift the voltage of a memory cell in a direction opposite to the voltage shift caused by charge leakage or can operate to shift the voltage of a memory cell in the same direction as charge leakage. Smaller threshold voltages of a memory cell corresponds to a smaller amount of charge which can make the memory cell more sensitive to soft writes and to erase/write/read disturbs which add charge. Thus, memory cells having an analog voltage representing the digital symbol 10 in FIG. 3 may be more sensitive to soft writes and to erase/write/read disturbs than memory cells having an analog voltage representing the digital symbol 01, for example.

It can be useful to anticipate and compensate for charge leakage and/or other perturbations of the stored charge by using a reference voltage that is shifted by an amount related to the expected shift in the threshold voltage distribution. In some implementations, the memory system may be capable of determining the amount of voltage shift that should be used to compensate for the expected change in the voltage distribution. For example, the memory system may include reference voltage circuitry (see 134, FIG. 1) configured to calculate the amount of voltage shift from the nominal reference voltage based on factors related to the configuration and use (operational history) of the memory cells. The configuration and use factors may include the physical and material configuration of the memory cell, e.g., dimensions, thickness, and doping, etc., the charge currently stored on the memory cell (also expressed as the voltage of the memory cell), the history of program/erase cycles experienced by the memory cell, the type of data page stored by the memory cell being read, e.g., MSB page or LSB page, the history of data errors of the memory cell, the history of read, write, and erase operations performed on other memory cells that can potentially affect the charge stored on the memory cell, the length of time that charge has been stored on the memory cell, the temperature of the memory cell at the time of the program operation, the operating temperature of the memory, factory characterization of the memory cells, subsequent characterization of the memory cells, and/or other factors. In some implementations, the reference voltage control circuitry may calculate the voltage shift as a function of only one of these configuration and use factors, e.g., data retention time. In some implementations, the reference voltage control circuitry may calculate the voltage shift as a function of multiple configuration and use factors. The various configuration and use parameters of the memory cell and/or the characterization data may be stored in a cache accessible by the memory controller. In some cases, some of the configuration and use factors and/or characterization data are stored within the memory.

The configuration and use factors may operate interdependently to alter the threshold voltage of a memory cell. For example, the rate of charge leakage from a memory cell may increase with the number of program/erase cycles experienced by the memory cell. Threshold voltages representing certain data symbols may make the memory cell more susceptible to charge loss or charge gain than other analog voltages that represent other data symbols. For example, with reference to FIG. 5, if the memory cell is programmed with an analog voltage that initially represents the 01 symbol the memory cell may be more susceptible to charge loss than if the cell was programmed to an analog voltage representing the 11 symbol.

The shift in the voltage of a memory cell, $\Delta_P$, due to use factors $U_1, U_2, U_3, \ldots U_J$ may be determined using the charge loss/gain model of the memory cell, expressed as $f(U_1, U_2, U_3, \ldots U_J)$, where $U_1, U_2, U_3 \ldots U_J$ are use factors such as those listed above. The amount of change of the voltage stored in a memory cell due to each use factor $U_1, U_2, U_3, \ldots U_J$ may be estimated based on a factory characterization of the threshold voltage distribution (an a priori characterization) of all memory cells or a population of similar memory cells before the memory cell is in use, and/or may be estimated based on a characterization of the threshold voltage distribution during the time that the memory is in use (a posteriori characterization). The a posteriori characterization may be performed at any time, or at periodic intervals during operation of the memory. In some cases, the a posteriori characterization can be conveniently performed during garbage collection.

For example, when a prior population data is used, then the shifted reference voltage may be calculated:

$$VRef_{shifted} = VRef_{nominal} + \Delta_P$$

where $\Delta_P$ is the expected voltage shift determined using the charge/loss gain model $f(U_1, U_2, U_3, \ldots U_J)$ of the memory cell derived from population data.

Characterization of the memory cells may occur numerous times over the life of the memory device, allowing rates of change in charge loss or gain behavior for each configuration and use factor or multiple factors to be calculated. In some cases, the characterization is based on threshold voltage measurements taken from a sample of cells of the memory. The calculated rates of change can be used to extrapolate the expected changes from the configuration and use factors.

For example, when a posteriori memory cell characterization data is used, then the shifted reference voltage may be calculated:

$$VRef_{shifted} = VRef_{nominal} + \Delta_C,$$

where $\Delta_C$ is the expected voltage shift determined using the charge loss/gain model, $f(U_1, U_2, U_3, \ldots U_J)$ of the memory cell derived from one or more characterization of the memory cell or memory cell array. In some implementations, the charge loss/gain model of the memory cell may be derived using a priori population data for use some factors and a posteriori characterization of the memory cell for other use factors. In some implementations, the charge loss/gain model may be adaptive. For example, a priori population data may initially be used to generate the charge loss/charge gain model, but as characterization data for the memory cell array is acquired, the charge loss/charge gain model may increasingly rely on the information acquired from the a posteriori characterization.

Figure 6A:
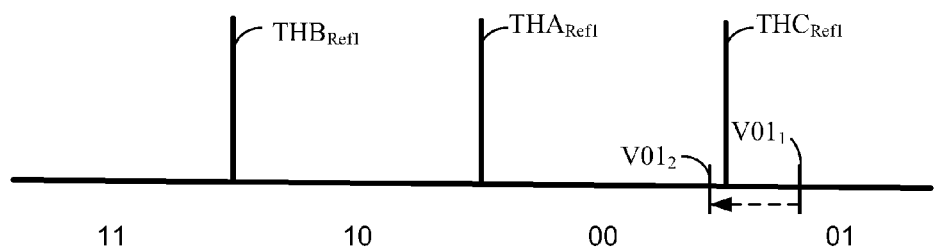
FIGS. 6A and 6B illustrate shifting a reference voltage for an initial or additional read operation.
Figure 6B:
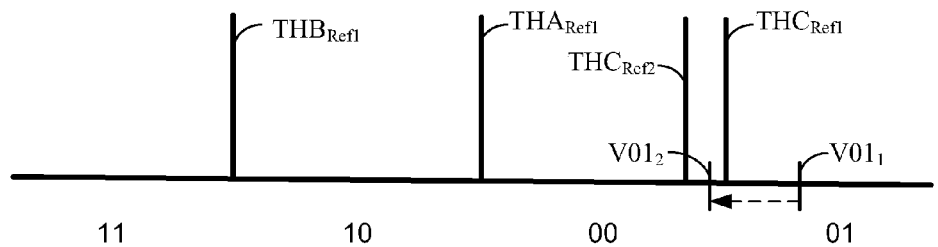

FIGS. 6A and 6B illustrate shifting a reference voltage for an additional read operation that is used to determine soft data. For purposes of illustration, FIG. 6A depicts a scenario wherein an analog voltage, $V01_1$, representing the digital symbol 01, has been programmed into a memory cell. Immediately after programming the memory cell, the digital symbol stored in the memory cell can be read by sensing the voltage $V01_1$ and comparing the voltage $V01_1$ to a nominal reference voltage $THC_{Ref1}$. Because $V01_1$ is greater than the nominal reference voltage $THC_{Ref1}$, the digital symbol stored in the memory cell is correctly identified and transferred to the memory controller as 01.

However, possibly due to charge leakage, which is a predominant mechanism for changes in the voltage distribution for this particular digital symbol, electrons stored on the floating gate of the memory cell can leak away, causing the voltage of the memory cell to decrease to voltage $V01_2$. If the memory cell is read after the charge leakage, comparison of the analog voltage $V01_2$ to the nominal reference voltage, $THC_{Ref1}$ leads to erroneous identification of the digital symbol stored in the memory cell as 00 rather than 01. This erroneous value is transferred from the memory array to the memory controller, where the decoder circuitry attempts to decode the data. The data may include too many errors to allow convergence.

In the scenario described in connection with FIG. 6A, the voltage change from $V01_1$ to $V01_2$ may be taken into account and compensated for by shifting the reference voltages used to interpret the threshold voltage of the memory cell. For example, as illustrated in FIG. 5C, lowering the reference voltage from the nominal reference voltage, $THC_{Ref1}$, to a shifted reference voltage, $THC_{Ref2}$, allows the digital symbol represented by $V01_2$ to be correctly interpreted as 01 rather than erroneously interpreted as 00. Comparison of the analog voltage $V01_2$ to shifted reference voltage $THC_{Ref2}$ indicates that $V01_2$ is greater than $THC_{Ref2}$ leading to the correct interpretation of the digital symbol stored in the memory cell as 01. Approaches for reusing information from multiple read operations, including read operations that use reference voltages shifted to compensate for expected charge loss or charge gain, are described in commonly owned U.S. Pat. No. 8,243,511 which is filed concurrently with the present application and is incorporated herein by reference in its entirety.

Figure 7:
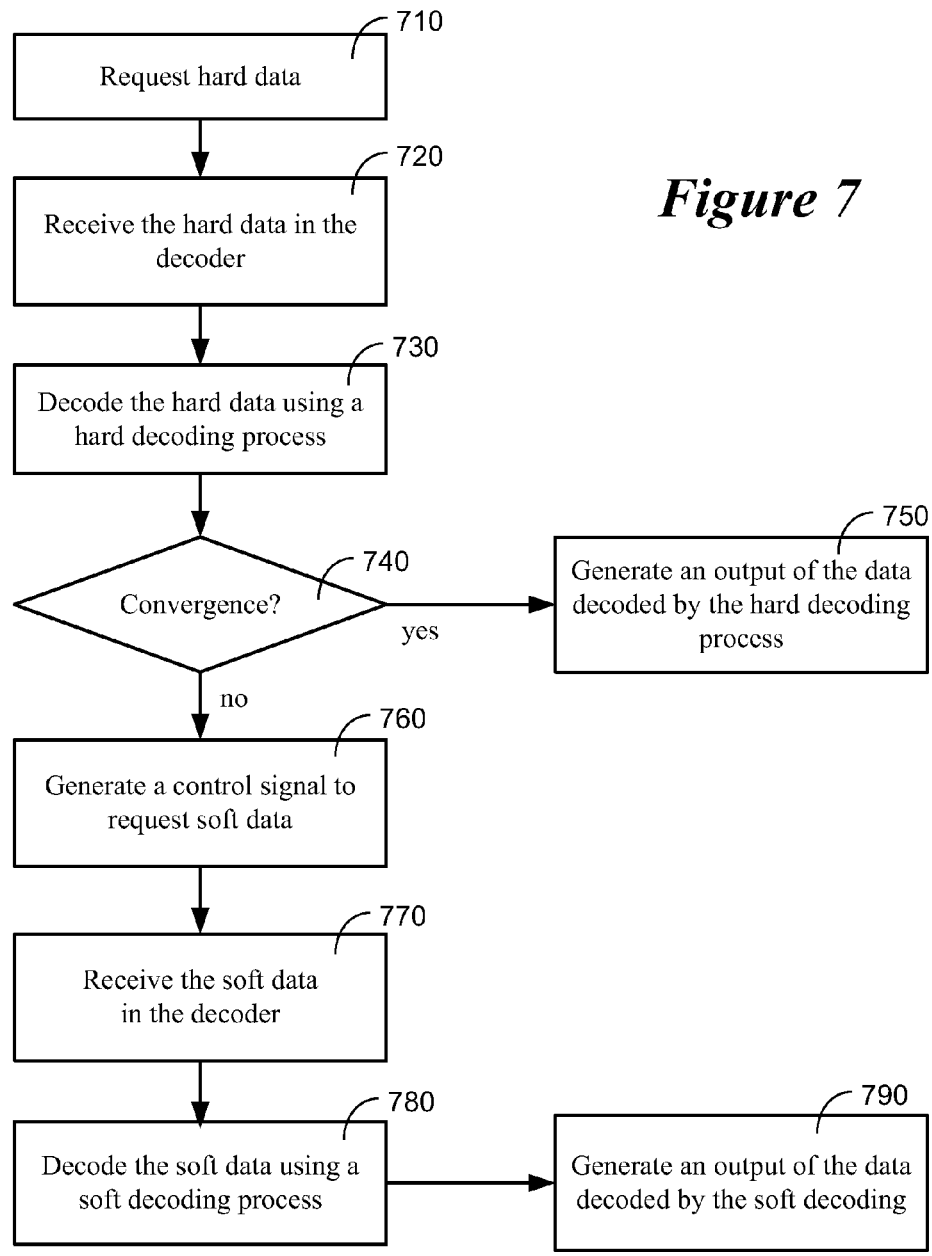
FIG. 7 is a flow graph illustrating a process that generates a request for soft data after conclusion of a hard decoding process.

In some cases, a control signal requesting the soft data may be generated concurrently or at about the same time as the request for the hard data, or at other times before the conclusion of a successful or unsuccessful hard decoding process. In some cases, the control signal that requests the soft data may be generated at or after the conclusion of the hard decoding process. FIG. 7 is a flow graph that depicts a process that generates a request for soft data after the unsuccessful conclusion of the hard decoding process. A request for hard data is generated 710 which initiates a read operation of the memory cells. The hard data that includes the digital symbols read from the memory cells without confidence information is received 720 in the decoder and is decoded 730 using a hard decoding process. If the hard decoding process achieves convergence 740, then the decoder outputs 750 the decoded data. However, if the hard decoding process fails to achieve convergence 740, then a request for soft data is generated 760 by the controller. The soft data received 770 by the decoder includes information about the digital symbols read from the memory cells and confidence information. The soft data is decoded 780 using a soft decoding process and the decoder outputs 790 the decoded information.

Figure 8:
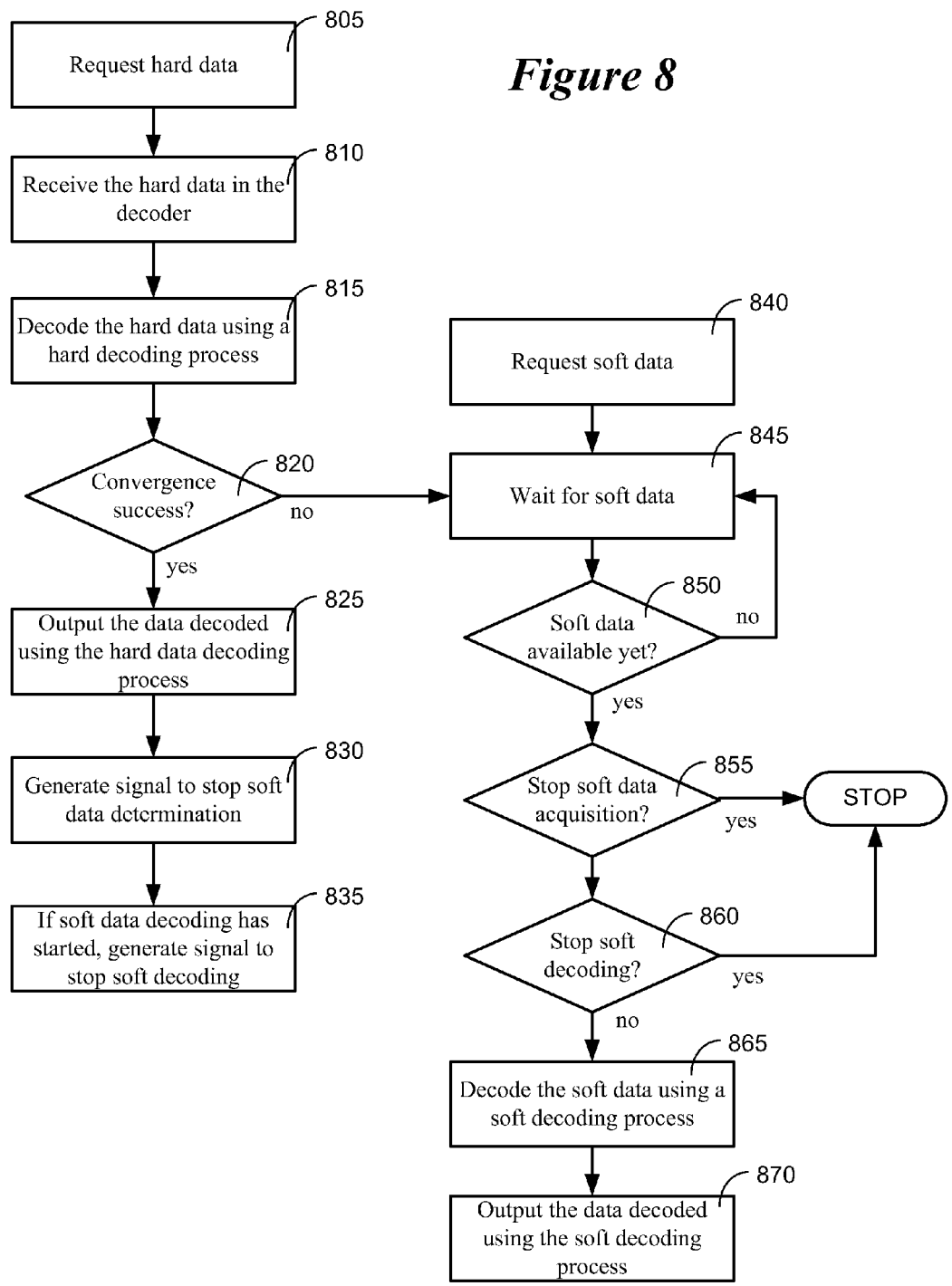
FIG. 8 illustrates a process that requests both hard data and soft data before the conclusion of a successful or unsuccessful hard decoding process.

FIG. 8 illustrates a process that requests 805, 840 both hard data and soft data before the conclusion of a successful or unsuccessful hard decoding process. The hard data is typically faster to obtain than the soft data and is received 810 in the decoder before the soft data is determined. Thus, the opportunistic hard decoding attempt 815 may be initiated while the soft data is being determined but before the soft data is available 850 in the decoder. If the hard decoding process is successful 820, then the decoder outputs 825 the decoded data. A signal is generated to stop 830 the determination of the soft data, e.g., to stop an additional read operation and/or calculation of confidence information. If the soft decoding process has begun, a signal is generated to stop 835 the soft decoding process.

However, if the hard decoding process is unsuccessful 820, then the soft decoding process commences 865 if the soft data is available 850. If the soft data is not available 850, then the decoder waits 845 for the soft data. At any time prior to the completion of the soft decoding process, if the hard decoding process successfully achieves convergence 820, the soft data acquisition and/or the soft decoding processes are terminated 855, 860.

Figure 9:
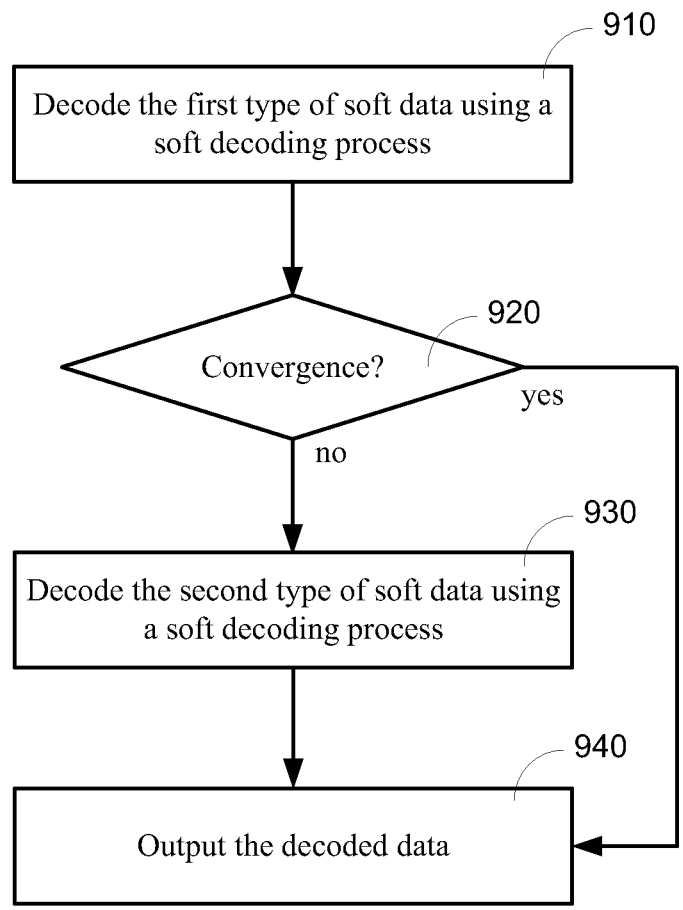
FIG. 9 illustrates a process wherein the decoder opportunistically attempts to decode a first type of soft data before attempting to decode a second type of soft data.

The flow graph of FIG. 9 illustrates a process that is similar in some ways to the process illustrated by FIG. 2, except that in the process of FIG. 9, the decoder opportunistically attempts to decode 910 a first type of soft data before attempting to decode 930 a second type of soft data. Each of the first and second types of soft data includes information about the digital symbols read from the memory cells along with data confidence information. The first type of soft data includes data confidence information that is determined based on a first source of information. The second type of soft data includes data confidence information that is determined based on a second source of information. For example, the data confidence information of the first type of soft data may be determined based on threshold voltage distributions that are estimated using configuration and use parameters of the memory cells, without performing an additional read operation. The data confidence information of the second type of soft data may be determined based on one or more additional read operations of the memory cells. Because the additional read operations take longer to perform than the estimation of the threshold voltage distributions, the decoder may opportunistically attempt to decode the first type of soft data before the second type of soft data is available. In this example, if the first soft decoding process 910 operating on the first type of soft data is unsuccessful 920, a second decoding process 930 operating on the second type of soft data commences and an output of the decoded data is generated 940.

In some cases, a control signal requesting the second type of soft data may be generated concurrently or at about the same time as the request for the first type of soft data or at another time before the conclusion of successful or unsuccessful decoding of the first type of soft data. If the soft decoding process operating on the first type of soft data achieves convergence, then acquisition of the second type of soft data and/or decoding the second type of soft data may be terminated. In some cases, the control signal to request the second type of soft data may be generated at or after an unsuccessful conclusion of the decoding process that decodes the first type of soft data.

Figure 10:
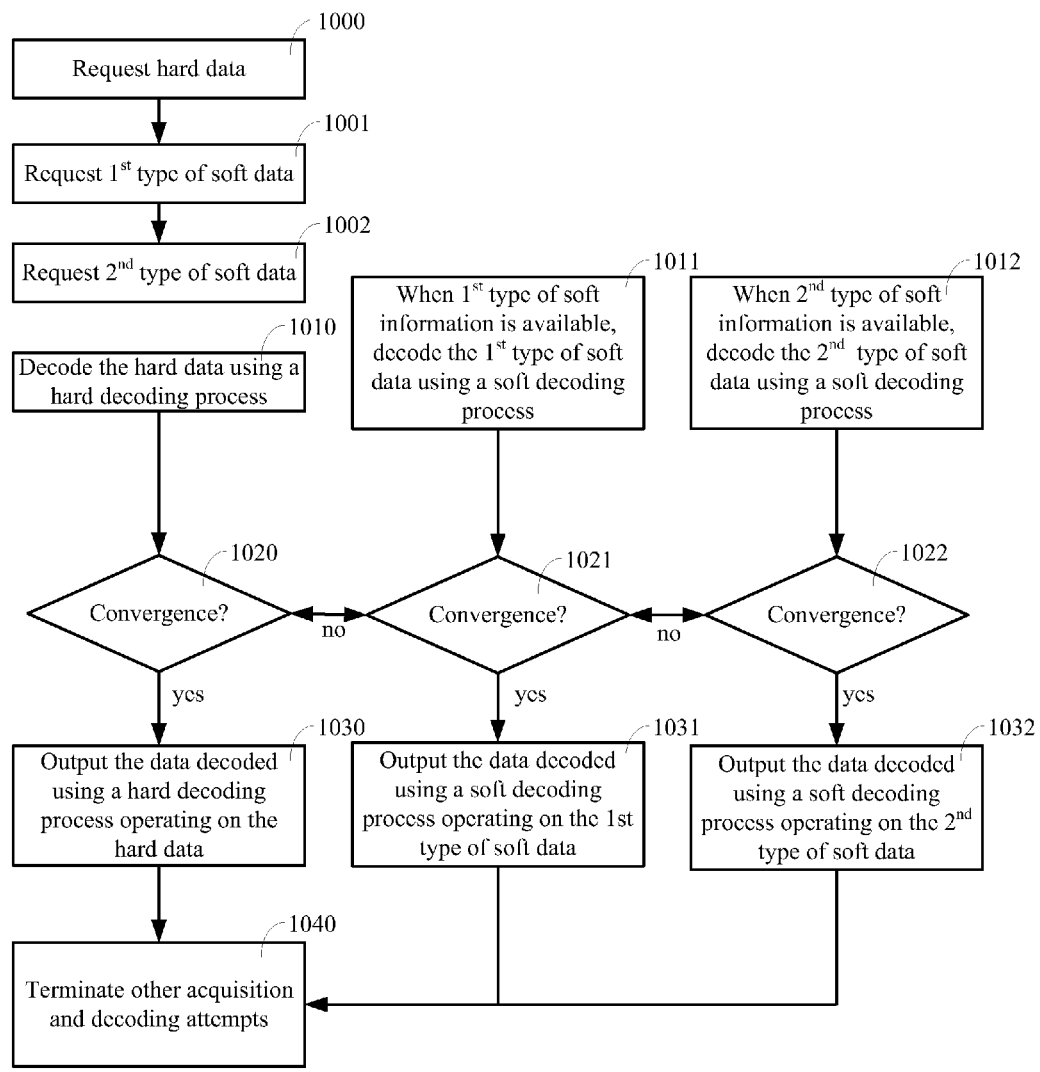
FIG. 10 is a flow diagram of a process that includes multiple opportunistic attempts to decode the data.

FIG. 10 is a flow diagram of a process that includes multiple opportunistic attempts to decode the data. In one scenario, the multiple decoding processes are opportunistically attempted, starting with data that can be acquired most quickly, followed by a decoding attempt operating on data that takes longer than the previously acquired data to obtain, followed by a decoding attempt operating on data that takes even longer to acquire, and so forth. In some implementations, all of the types of data can be requested at about the same time and/or before any decoding attempt achieves or fails to achieve convergence. In other implementations, one or more types of data can be requested after a decoding attempt fails to achieve convergence. As illustrated in FIG. 10, the three (or more) types of data may be requested 1000, 1001, 1002 before any of the decoding processes achieves convergence. The result of the first-in-time decoding process to achieve convergence is output and other information acquisition, determination of confidence information, and decoding processes are terminated.

Alternatively, the first soft decoding process can be initiated at or after the conclusion of the hard decoding process and the second soft decoding process can be initiated at or after the conclusion of the first soft decoding process. The most quickly acquired data, i.e., the hard data, is received in the decoder. If convergence is achieved using the most quickly acquired data, the encoded data is output. A control signal is generated that stop the acquisition of other types of data. For example, the control signal may terminate an additional read operation that is in progress, and/or may terminate a calculation of confidence information. If another decoding process is in progress, a control signal is generated that stops the other decoding process. In some cases, one control signal can accomplish both functions (terminating acquisition of data and decoding).

FIG. 10 illustrates multiple opportunistic decoding processes using a hard decoding process and two soft decoding processes. The hard decoding process begins 1010 when the hard data is available, a first soft decoding process begins 1011 when the first type of soft data is available, and a second soft decoding process begins 1012 when the second type of soft data is available. The first-in-time decoding process to achieve convergence 1020, 1021, 1022 outputs 1030, 1031, 1032 the decoded data. Other attempts to acquire soft data and/or decode the data are terminated 1040.

Figure 11A:
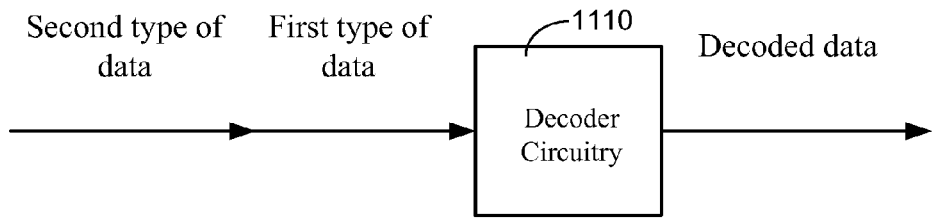
FIGS. 11A and 11B illustrate various configurations of decoder circuitry and control circuitry that may be used to opportunistically decode first received data before later received data is available to the decoder.
Figure 11B:
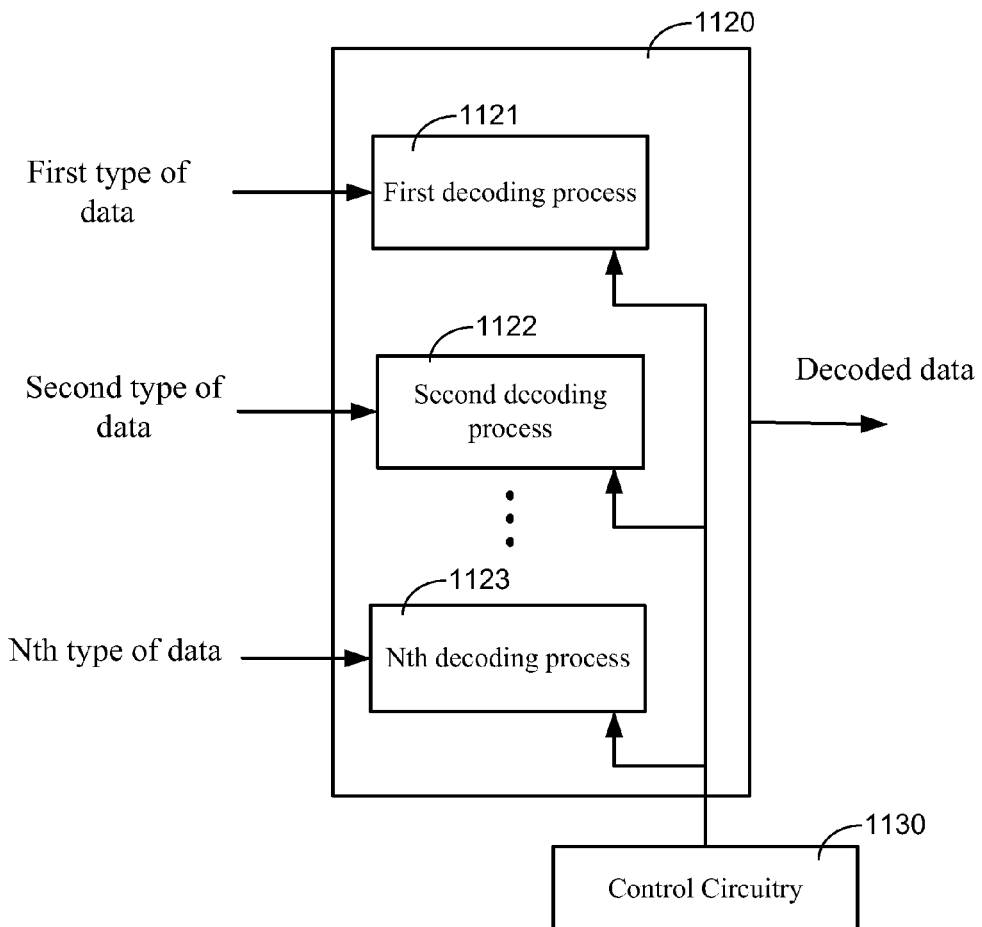

FIGS. 11A and 11B illustrate various configurations of the decoder circuitry 112 and control circuitry 122 (see, FIG. 1) that may be used to opportunistically decode first received data, e.g., hard data, before later received data, e.g., soft data, is available to the decoder. FIG. 11A illustrates a time multiplexed implementation wherein decoding the hard data and decoding the soft data is performed sequentially by the decoder circuitry 1110. In FIG. 11A, the hard data is decoded prior to decoding the soft data. In some cases, in addition to sequential data decoding, acquisition of hard and/or soft data may be implemented sequentially or may be implemented at least in part concurrently.

In some embodiments, multiple decoding processes may occur at least in part concurrently. For example, as illustrated in FIG. 11B, decoder circuitry 1120 may include multiple decoding processes 1121, 1122, 1123. All of the decoding processes or at least two of the decoding processes 1121, 1122, 1123 may be implemented at least in part concurrently. In some cases, acquisition of hard and/or soft data may be implemented sequentially or may be implemented at least in part concurrently. As illustrated in FIG. 11B, first received data, e.g., hard data, may be an input to a first decoding process 1121. Later received data, e.g., first and second types of soft data, may serve as inputs to additional decoding processes 1122, 1123. The confidence information of the first type of soft data is acquired from a first source and the confidence information of the second type of soft data is acquired from a second source. If the types of data are acquired and/or decoded concurrently, controller circuitry 1130 may generate signals to terminate the acquisition and/or decoding of data when convergence is achieved by a first-in-time decoding process to achieve convergence.

Figure 12:
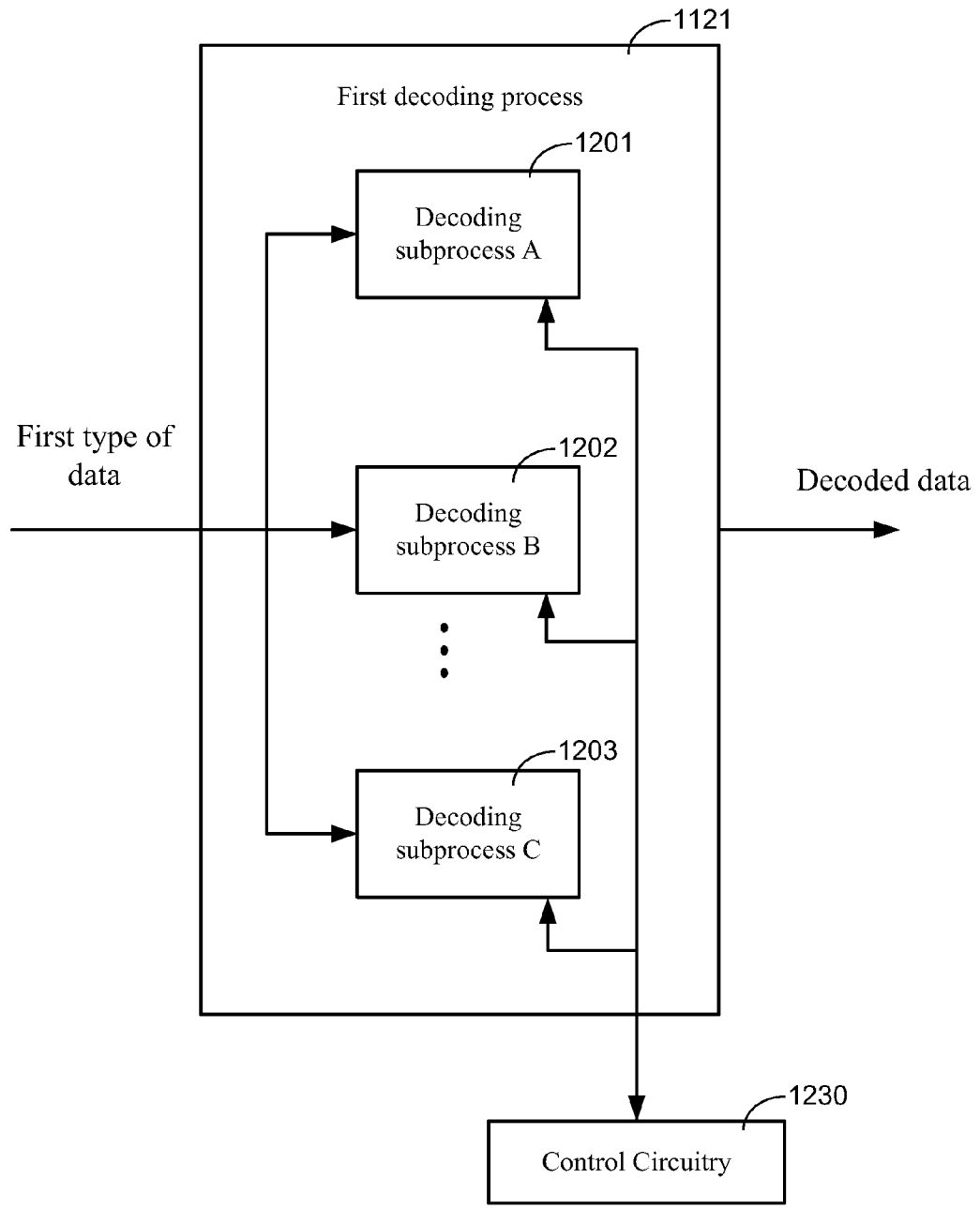
FIG. 12 illustrates decoding subprocesses used to implement multiple decoding algorithms and/or to test multiple decoding hypotheses.

Each of the decoding processes illustrated in FIGS. 11A and 11B may implement only one algorithm and/or use only one hypothesis to decode the data. Alternatively, each of the decoding processes illustrated in FIGS. 11A and 11B may sequentially or concurrently implement multiple decoding subprocesses. Each of the multiple subprocesses uses a different algorithm and/or tests a different hypothesis when attempting to decode the data. Each of the multiple decoding subprocesses is capable of decoding the data to convergence without relying on the input of another of the decoding subprocess. Multiple algorithm/hypotheses decoding is depicted in FIG. 12, which illustrates, as an example, the first decoding process 1121 of FIG. 11B. It will be appreciated that the decoder circuitry 1110 of FIG. 1A, the second decoding process 1122 of FIG. 11B, and/or the Nth decoding process 1123 of FIG. 11B may also sequentially or concurrently test multiple hypotheses and/or multiple algorithms.

As illustrated in FIG. 12, the first decoding process 1121 implements multiple decoding subprocesses 1201, 1202, 103, each of the multiple decoding processes 1201, 1202, 1203 decode the first type of data using a different algorithm and/or testing a different hypothesis. For example, subprocess A 1201 may test hypothesis A, subprocess B 1202 may test hypothesis B, subprocess C 1203 may test hypothesis C. Each of the hypotheses tested are applied to the same input data. For example, each of subprocesses A-C may apply different signal/noise probability distributions to the first type of data, e.g., hard data or soft data. In some cases, one decoding subprocess may test a Gaussian distribution, and other decoding subprocesses may test a t distribution, uniform distribution, triangular distribution, superposition of multiple distributions, or an empirical distribution.

Depending on the hardware and/or software architecture of the decoder, the decoding subprocesses may be implemented sequentially or concurrently. In one implementation, the hypotheses A-C may be tested sequentially, starting from the most likely hypothesis to achieve convergence and ending with the least likely hypothesis to achieve convergence. In another implementation, each of the decoding subprocesses A-C 1201, 1202, 1203 may operate concurrently or at least in part concurrently to test hypotheses A-C. The decoded data output from the decoder 1121 is the result of the first-in-time decoding subprocess 1201, 1202, 1203 to achieve convergence. This implementation is particularly useful for flash memory systems where controller circuitry controls multiple memory chips and therefore the system includes duplicate detector/decoder hardware. In yet another implementation, testing the hypotheses may be a hybrid of sequential and concurrent operation, wherein more than one but less than all hypotheses are tested concurrently.

Alternatively or additionally, each of the subprocesses 1201, 1202, 1203 may implement a different decoding algorithm, i.e., subprocess A 1201 may implement algorithm A, subprocess B 1202 may implement algorithm B, subprocess C 1203 may implement algorithm C. The algorithms implemented by the subprocesses 1201, 1202, 1203 can have the same complexity, or may differ in complexity. In some cases, one of the subprocesses may implement a relatively less complex algorithm that is capable of achieving convergence more quickly than other algorithms implemented by other subprocesses. For example, the decoder may be an LDPC decoder, the less complex algorithm implemented by one of the subprocesses may be a min-sum algorithm, and the more complex algorithm implemented by another of the subprocesses may be a belief propagation algorithm. In some scenarios, if there are few errors in the data, the less complex min-sum algorithm can achieve convergence more quickly or may be with less power consumption than the belief propagation algorithm. However, when more errors are present, the min sum algorithm may fail to achieve convergence, whereas the belief propagation algorithm, which has superior error detection and correction power, can achieve convergence.

The algorithms may be tested sequentially, starting from the fastest and/or least complex algorithm and ending with the slowest and/or most complex. In some cases, each of the decoding subprocesses 1201, 1202, 1203 may operate concurrently to test algorithms A-C. As previously mentioned, concurrent implementation is particularly useful for flash technology. In some cases, the decoding subprocesses 1201, 1202, 1203 may proceed as a hybrid of sequential and concurrent operation, wherein more than one but less than all decoding subprocesses 1201, 1202, 1203 are tested concurrently. The decoded data output from the decoder 1121 is the result of the first in time decoding subprocess 1201, 1202, 1203 to achieve convergence.

In some configurations, the output of one decoding subprocess 1201, 1202, 1203 may be used to control one or more other decoding subprocesses 1201, 1202, 1203. For sequential operation, if convergence is achieved by a decoding subprocess that is implemented earlier than another subprocess, the later implemented subprocess may not be initiated by controller 1230. A failure to achieve convergence of a decoding process 1201, 1202, 1203 may cause the controller 1230 to trigger implementation of one or more of the other decoding processes 1201, 1202, 1203. For concurrent operation, a first-in-time decoding subprocess 1201, 1202, 1203 to achieve convergence may cause the controller 1230 to terminate other decoding sub processes 1201, 1202, 1203.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method of decoding data read from memory cells of a solid state, non-volatile memory, comprising:
    receiving hard data that includes information about the data read from the memory cells without confidence information;
    attempting to decode the hard data using a hard decoding process prior to a time that soft data is available to the decoder, the soft data including information about the data stored in the memory cells and data confidence information;
    in response to the hard decoding process failing to achieve convergence, decoding the soft data using a soft decoding process;
    implementing an additional soft decoding process operating on additional soft data that is acquired from a different source of information than the soft decoding process; and
    generating an output of the decoded data.

2. The method of claim 1, wherein:
    the hard data is acquired from an initial read of the memory cells; and
    the soft data is determined using information from an additional read operation of the memory cells.

3. The method of claim 2, wherein the additional read operation uses a reference voltage that is different from a reference voltage used for the initial read operation.

4. The method of claim 1, further comprising one or more of acquiring the information used to determine the soft data, determining the soft data, and decoding the soft data only if the hard decoding process fails to achieve convergence.

5. The method of claim 1, further comprising one or more of generating a request for acquisition of information used to determine the soft data, initiating a process to determine the soft data, and initiating the soft data decoding process regardless of success or failure of the hard decoding process to achieve convergence.

6. The method of claim 1, wherein one or both of the hard decoding process and the soft decoding process are LDPC decoding processes.

7. The method of claim 1, wherein one or both of the hard decoding process and the soft decoding process includes a plurality of decoding subprocesses, each of the decoding subprocesses capable of independently achieving convergence.

8. The method of claim 7, wherein each of the decoding subprocesses tests a different decoding hypothesis.

9. The method of claim 7, wherein each of the decoding subprocesses implements a different decoding algorithm.

10. The method of claim 1, wherein implementing the additional soft decoding process comprises implementing the additional soft decoding process in response to the soft decoding process failing to achieve convergence.

11. The method of claim 1, further comprising, in response to the soft decoding process achieving convergence, terminating the additional soft decoding process.

12. A solid state, non-volatile memory system, comprising:
    input circuitry configured to receive hard data, the hard data including information about data read from the memory cells without confidence information, and soft data, the soft data including information about the data read from the memory cells with confidence information;
    decoder circuitry configured to:
        implement a hard decoding process operating on the hard data during a time that the soft data associated is unavailable to the decoder circuitry;
        implement a soft decoding process operating on the soft data at a later time when the soft data becomes available to the decoder; and
        in response to the soft decoding process failing to achieve convergence, implement an additional soft decoding process operating on additional soft data that is acquired from a different source of information than the soft decoding process; and
    output circuitry configured to output the decoded data obtained from the hard decoding process or the soft decoding process.

13. The system of claim 12, further comprising controller circuitry configured to generate a request to acquire information used to determine the soft data, generate a request to determine the soft data, and generate a control signal to initiate the soft decoding process.

14. The system of claim 13, wherein the controller circuitry is configured to generate the request to acquire information used to determine the soft data, to generate the request to determine the soft data, and generate the control signal to initiate the soft decoding process only in response to the hard decoding process failing to achieve convergence.

15. The system of claim 13, wherein the controller circuitry is configured to generate the request to acquire the information used to determine the soft data, to generate the request to determine the soft data, and generate the control signal to initiate the soft decoding process regardless of whether or not the hard decoding process achieves convergence.

16. The system of claim 15, wherein the controller circuitry is configured to generate a control signal to terminate acquisition of the information used to determine the soft data, to generate a control signal to terminate the determination of the soft data and to generate a control signal to terminate the soft decoding process in response to the hard decoding process achieving convergence.

17. The system of claim 12, further comprising:
   solid state memory cells; and
   a detector, including
      detector circuitry configured to perform read operations to read data stored in the memory cells and to output hard data including information about the data read from the memory cells without confidence information;
      soft information circuitry configured to generate soft data, the soft data including information about the data read from the memory cells and confidence information.

18. The system of claim 17, wherein the soft information circuitry is configured to generate the soft data using noise statistics of the memory cell.

* * * * *